United States Patent
Liu et al.

(10) Patent No.: US 8,664,060 B2
(45) Date of Patent: Mar. 4, 2014

(54) SEMICONDUCTOR STRUCTURE AND METHOD OF FABRICATING THE SAME

(75) Inventors: An-Chi Liu, Tainan (TW); Chun-Hsien Lin, Tainan (TW); Yu-Cheng Tung, Kaohsiung (TW); Chien-Ting Lin, Hsinchu (TW); Wen-Tai Chiang, Tainan (TW); Shih-Hung Tsai, Tainan (TW); Ssu-I Fu, Kaohsiung (TW); Ying-Tsung Chen, Kaohsiung (TW); Chih-Wei Chen, Taichung (TW)

(73) Assignee: United Microelectronics Corp., Hsin-Chu (TW)

( * ) Notice: Subject to any disclaimer, the term of this patent is extended or adjusted under 35 U.S.C. 154(b) by 99 days.

(21) Appl. No.: 13/367,382

(22) Filed: Feb. 7, 2012

(65) Prior Publication Data

US 2013/0200470 A1    Aug. 8, 2013

(51) Int. Cl.
*H01L 29/78* (2006.01)

(52) U.S. Cl.
USPC ........... 438/229; 257/402; 257/347; 257/255; 257/368; 257/E29.266; 257/E21.421; 257/E21.435; 257/E21.411; 438/283; 438/9; 438/157; 700/121

(58) Field of Classification Search
USPC .......... 257/402, 347, 255, 368; 438/157, 229, 438/283, 9; 700/121
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,094,650 B2 | 8/2006 | Chaudhary et al. | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 7,776,741 B2 | 8/2010 | Reid et al. | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2008/0311687 A1* | 12/2008 | Yamashita et al. ................. | 438/9 |
| 2009/0108313 A1 | 4/2009 | Doyle | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |

(Continued)

*Primary Examiner* — Jerome Jackson, Jr.
*Assistant Examiner* — Bo Fan
(74) *Attorney, Agent, or Firm* — Winston Hsu; Scott Margo

(57) ABSTRACT

A semiconductor structure and a method of fabricating the same comprising the steps of providing a substrate, forming at least one fin structure on said substrate, forming a gate covering said fin structure, forming a plurality of epitaxial structures covering said fin structures, performing a gate pull-back process to reduce the critical dimension (CD) of said gate and separate said gate and said epitaxial structures, forming lightly doped drains (LDD) in said fin structures, and forming a spacer on said gate and said fin structures.

20 Claims, 13 Drawing Sheets

(56) References Cited

U.S. PATENT DOCUMENTS

| | | |
|---|---|---|
| 2010/0144121 A1 | 6/2010 | Chang |
| 2010/0167506 A1 | 7/2010 | Lin |
| 2011/0079829 A1 | 4/2011 | Lai et al. |
| 2011/0193141 A1* | 8/2011 | Lin et al. .......... 257/255 |
| 2011/0227162 A1* | 9/2011 | Lin et al. .......... 257/368 |
| 2012/0012932 A1* | 1/2012 | Perng et al. ....... 257/347 |
| 2012/0015493 A1* | 1/2012 | Lin et al. .......... 438/303 |

* cited by examiner

SEMICONDUCTOR STRUCTURE AND METHOD OF FABRICATING THE SAME

BACKGROUND OF THE INVENTION

1. Field of the Invention

The present invention relates generally to a semiconductor device and method of fabricating the same. In particular, the present invention relates to a semiconductor device with a pull backed gate structure and a method of fabricating the same.

2. Description of the Prior Art

In recent years, as various kinds of consumer electronic products are constantly improved and miniaturized, the size of semiconductor components have reduced accordingly, in order to meet requirements of high integration, high performance, and low power consumption.

With the trend in the industry being towards scaling down the size of the metal oxide semiconductor transistors (MOS), three-dimensional or non-planar transistor technology, such as fin field effect transistor technology (Fin FET) has been developed to replace planar MOS transistors. The three-dimensional structure of a fin FET increases the overlapping area between the gate and the fin structure of the silicon substrate, the channel region is therefore accordingly more effectively controlled. The drain-induced barrier lowering (DIBL) effect and the short channel effect are therefore reduced. The channel region is also longer for an equivalent gate length, thus the current between the source and the drain is increased. In addition, the threshold voltage of the fin FET can be controlled by adjusting the work function of the gate.

In conventional processes for fabricating fin FET devices, the sidewalls of the gate and fin structures are covered with a spacer. The material of said spacer tends to remain on the sidewalls of the fin structure, and the poor gap filling capacity makes it hard to fill the recess or the trench structure during the formation of said spacer. Furthermore, the presence of a spacer will hinder the following ion implantation process for forming lightly doped drain (LDD), because the dopants will be blocked by the spacer and will be hard to be implanted in the sidewalls of the fin structures. Thus, the gate device formed by this conventional process may induce a large electric field gradient and impact the electrical properties of the gate device.

Accordingly, the present invention is directed to improve the conventional forming process for fin FET devices, in order to further enhance the performance of the devices.

SUMMARY OF THE INVENTION

To improve the above-mentioned drawbacks of the prior art, a new semiconductor structure and a method for fabricating the same is provided. The method of the present invention overcomes the problem of the dopants being easily blocked by the spacer during the ion implantation process by forming a lightly doped drain (LDD) structure after the gate pullback process. Furthermore, the electrical properties of gate devices formed by this method are further improved by using low-K material to form the spacers after the formation of said lightly doped drain.

One object of the present invention is to provide a non-planar semiconductor process comprising the steps of providing a substrate, forming at least one fin structure on said substrate, forming a gate covering parts of said fin structures, forming a plurality of epitaxial structures covering said fin structures at both sides of said gate, forming a source and a drain respectively in said fin structures and said epitaxial structures at both sides of said gate, performing a gate pullback process to trim said gate so that said gate and said epitaxial structures at both sides of said gate are separated, performing an ion implantation process to form a lightly doped drain (LDD) respectively in said fin structures between said gate and said epitaxial structures at both sides of said gate, and forming a spacer on the sidewalls of said gate and said epitaxial structures.

Another object of the present invention is to provide a planar semiconductor process comprising the steps of providing a substrate, forming a gate on said substrate; forming epitaxial structures, forming a source and a drain respectively in said epitaxial structures at both sides of said gate, performing a gate pullback process to trim said gate so that said gate and said epitaxial structures at both sides of said gate are separated, performing an ion implantation process to form lightly doped drain (LDD) in said fin structures between said gate and said epitaxial structures at both sides of said gate, and forming a spacer on the sidewalls of said gate.

Another object of the present invention is to provide a non-planar semiconductor structure comprising a substrate, at least one fin structure on said substrate, a gate covering parts of said fin structures and parts of said substrate, a plurality of epitaxial structures covering said fin structures at both sides of said gate and being separated from said gate, wherein each of said gate, said epitaxial structure, and said fin structure define a recess, a source and a drain formed respectively in said fin structures and said epitaxial structures at both sides of said gate, lightly doped drains formed respectively in said fin structures between said gate and said epitaxial structure at both sides of said gate, and a spacer formed on the sidewalls of said gate and said epitaxial structures, wherein the portion of said spacer filling in said recesses is leveled with or lower than the top surface of said epitaxial structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
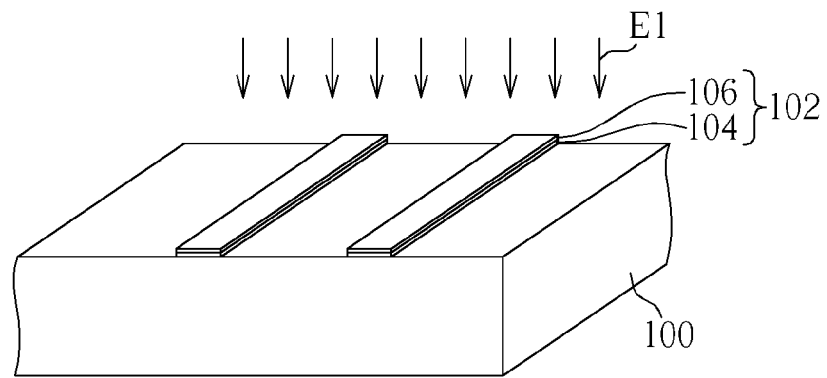
FIGS. 1-14 are cross-sectional views illustrating the flow of a non-planar semiconductor process in accordance with one embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The embodiments will now be explained with reference to the accompanying drawings to provide a better understanding of the process of the present invention, wherein FIGS. 1-14 are cross-sectional views illustrating the flow of a non-planar semiconductor process in accordance with one embodiment of the present invention; FIG. 15 is a prospective view illustrating the gate device formed by the process of the present invention; FIGS. 16-21 are cross-sectional views illustrating the flow of a planar semiconductor process in accordance with another embodiment of the present invention; and FIGS. 22-25 are cross-sectional views illustrating the flow of a replacement metal gate (RMG) process in accordance with one further embodiment of the present invention.

Figure 2:
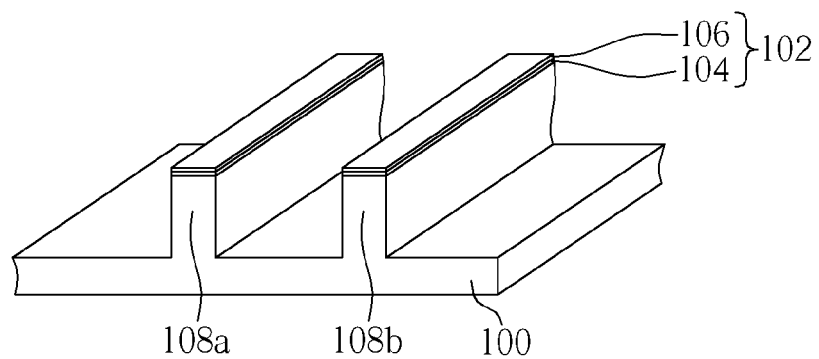

First, please refer to FIGS. 1-15. Those figures illustrate sequentially the flow of a non-planar semiconductor process. The non-planar semiconductor process of the present invention comprises fabricating a fin field-effect transistor (Fin FET) or a tri-gate MOSFET. In a first embodiment, bulk silicon is used as a substrate. First, as shown in FIG. 1, a substrate 100 (ex. Si substrate) is provided as the base of the whole semiconductor structure. Substrate 100 may be provided with already predetermined NMOS regions and PMOS regions and corresponding P-wells and N-wells. Subsequently, a patterned mask layer 102 is formed on the substrate 100 as the etching mask for the following etching process that will form 3D fin structures, wherein the mask layer 102 may include a single material layer or a plurality of stacked material layers, such as a pad oxide layer 104 (ex. silicon oxide) and a nitride layer 106 (ex. silicon nitride) formed on pad oxide layer 104. The mask layer 102 may be patterned by performing a lithography and an etching process E1 on a deposited material so as to expose parts of the substrate 100. After patterning the mask layer 102, as shown in FIG. 2, another etching process is performed subsequently by using said patterned mask layer 102 as a mask to transfer the pattern defined by the mask layer 102 to the substrate 100, thereby forming protruding and parallel fin structures 108a and 108b. In this embodiment, the number of fin structures defined by the mask layer 102 is two, but is not limited thereto.

Figure 3:
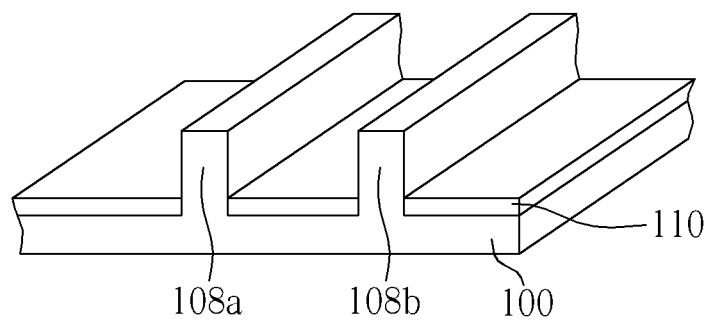

After the formation of the fin structures 108a and 108b, as shown in FIG. 3, an isolation structure 110 is subsequently formed between each of the fin structures by successively performing a deposition, a planarization, and a back etching process. For example, the isolation structure 110 may be an oxide layer, which may be formed by shallow trench isolation technologies, for example: first forming an isolation layer (not shown) to cover fin structures 108a and 108b, then performing an etch-back process to form the isolation structure 110. This way, the two fin structures 108a and 108b are formed on the substrate 100 and an isolation structure 110 is formed between the fin structures 108a and 108b. In one preferred embodiment, the width of the fin structures 108a and 108b is about 20 nm, while the height of the fin structures 108a and 108b protruding out of the isolation structure 110 is about 30 nm. The mask layer 102 on the fin structures may be removed to form a tri-gate MOSFET. In another embodiment, the mask layer 102 may be kept to form a fin FET in a following process.

Figure 4:
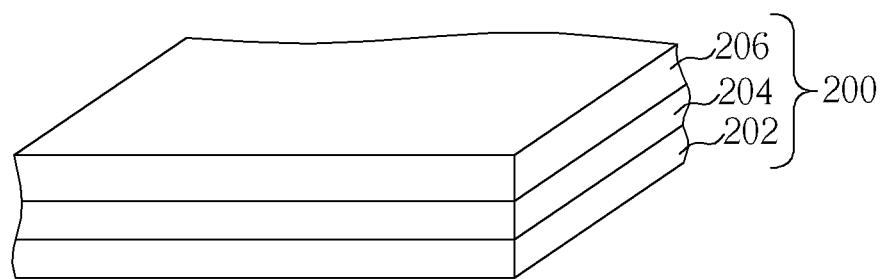
Figure 5:
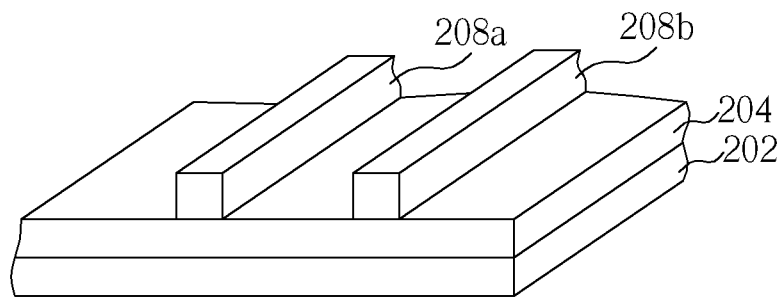

In addition to the example of using bulk Si as the substrate, in another embodiment, silicon-on-insulator (SOI) may be used as the substrate. As shown in FIG. 4, a SOI substrate is first provided comprising: a substrate 202, a bottom oxide layer 204 on the substrate 202, and a silicon layer 206 on bottom oxide layer 204, wherein said silicon layer 206 is a single crystal Si layer used to form various semiconductor devices. Subsequently, as shown in FIG. 5, a silicon layer 206 is patterned with a mask layer to form the fin structures 208a, 208b and expose parts of the bottom oxide layer 204. In this embodiment, the two fin structures 208a and 208b are formed on an isolation structure (i.e. the bottom oxide layer 204), thus good isolation may be provided for the gate elements formed in following process, and the STI process may be skipped. The method of patterning the silicon layer 206 is well-described in the previous embodiment; therefore no unnecessary detail will be given herein for simplicity.

For the above-mentioned two embodiments using bulk Si and SOI respectively as the substrate, as shown in FIG. 1, the isolation structure 110 in bulk Si is formed only between each fin structures (ex. 108a and 108b), while the bottom oxide layer 204 in SOI substrate 200, as shown in FIG. 5, is formed under the fin structures (ex. 108a and 108b). However, this difference will not influence the following processes.

Figure 6:
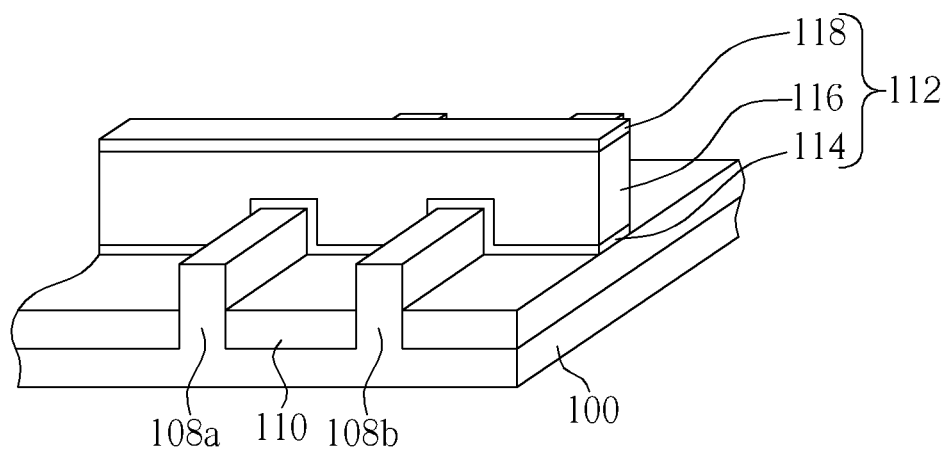

The bulk Si can be used as the substrate to explain the process of present invention in following processes. As shown in FIG. 6, a gate structure 112 is formed on a part of the isolation structure 110 and a part of the fin structures 108a and 108b. Said gate structure 112 traverses multiple fin structures, thereby constructing a non-planar gate device. The gate structure 112 may be formed by a series of processes such as deposition, chemical mechanical polishing (CMP) and patterning. The gate structure 112 may comprise a gate dielectric layer 114 (such as $SiO_2$ or high-k material) on parts of the isolation structure 100 and parts of the fin structure 108a and 108b, a gate electrode 116 on said gate dielectric layer 114, and a cap layer 118 on said gate electrode 116. The forming methods of these material layers are well-known in the art, and are not described herein.

In the present invention, a gate pullback step will be performed in the following processes to trim the critical dimension (CD) of gate structure 112, and a replacement metal gate process may be optionally performed after the formation of the gate device to replace the gate electrode with at least one work function metal plus at least one low-resistivity metal. For this purpose, take gate first process for example, the material of the gate electrode 116 may be selected from the group of poly-Si, salicide, metal, or the combination thereof. On the other hand, take gate last process for example, the material of the gate electrode 116 may be selected from the group of poly-Si, SiN, SiON, SiCN or advanced pattern film (APF) provided by Applied Materials, or a combinations thereof, while the corresponding cap layer 118 may be of SiN or $SiO_2$. The detailed description of the above-mentioned pullback process and the optional replacement metal gate process will be explained in the following embodiment.

Figure 7:
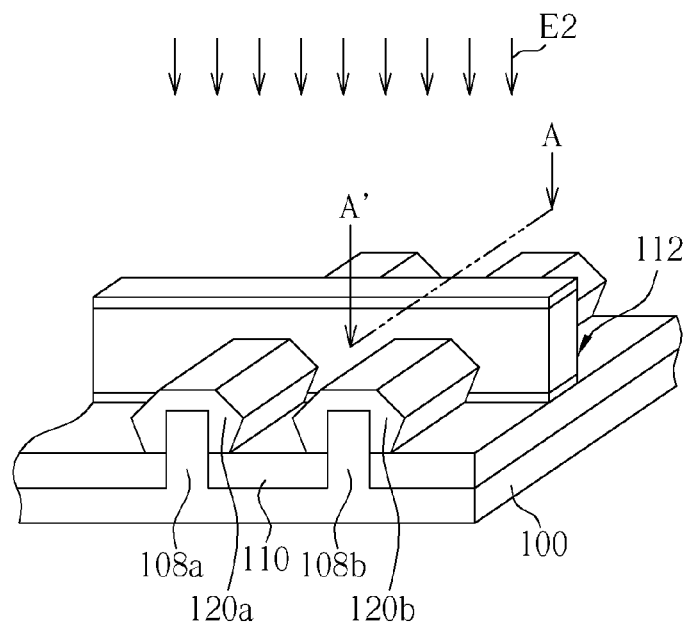

After the formation of the gate structure 112, as shown in FIG. 7, an epitaxy process E2 is performed to form epitaxial structures 120a and 120b surrounding the gate structure 112. In this step, the epitaxial structure 120a and 120b are formed on the surface of the fin structure 108a and 108b. The function of the epitaxial structures 120a and 120b is to increase the volume and the surface area of the fin structures 108a and 108b (that serve as source/drain regions), so that the metal layers formed in later processes, such as titanium (Ti), cobalt (Co), nickel (Ni), etc. can more easily cover the surface of the epitaxial layers 120a and 120b for performing self-aligning salicide processes. The material of the epitaxial structures 120a and 120b may include silicon germanium (SiGe), silicon carbide (SiC), a combination thereof, or other III-V compounds, depending on the type of multi-gate FET (such as PMOS or NMOS).

Figure 8:
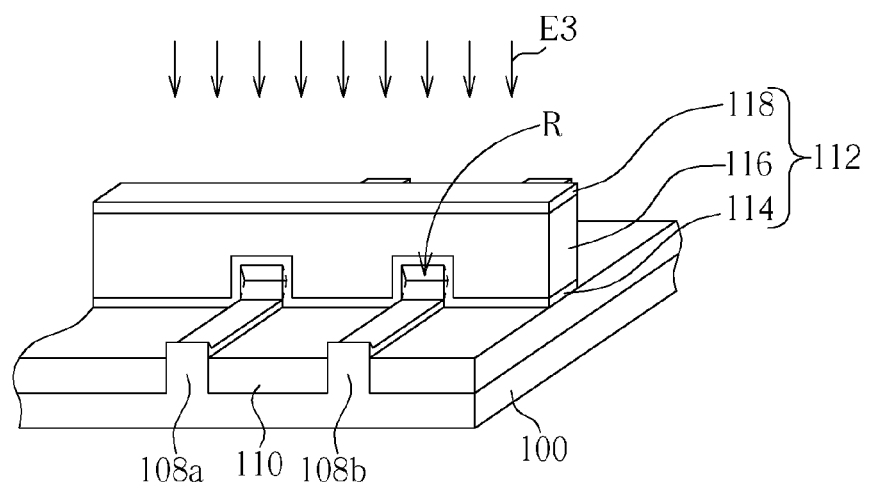

In another embodiment of the present invention, the fin structures 108a and 108b on epitaxial structure may be a stress source to strain the abutted silicon channel in order to increase the mobility of the electrons ($e^-$) and the holes ($h^+$) in the silicon channel. In this embodiment, as shown in FIG. 8, an etching process E3 is first performed to etch parts of the fin structure 108a and 108b at both sides of the gate 112. The etching process E3 has different etching rate in different crystalline planes, so that a recess R will be formed on the sidewall of the fin structures 108a and 108b respectively. The etching process E3 may include a dry etching process and a wet etching process, or only a wet etching process. For example, the wet etching process comprises etching by an etchant containing ammonia, hydrogen peroxide and water. Alternately, the etchant may be ammonia etchant, methyl ammonium hydroxide etchant, hydroxide etchant, or ethylene diamine pyrocatechol etchant, etc.

Figure 9:
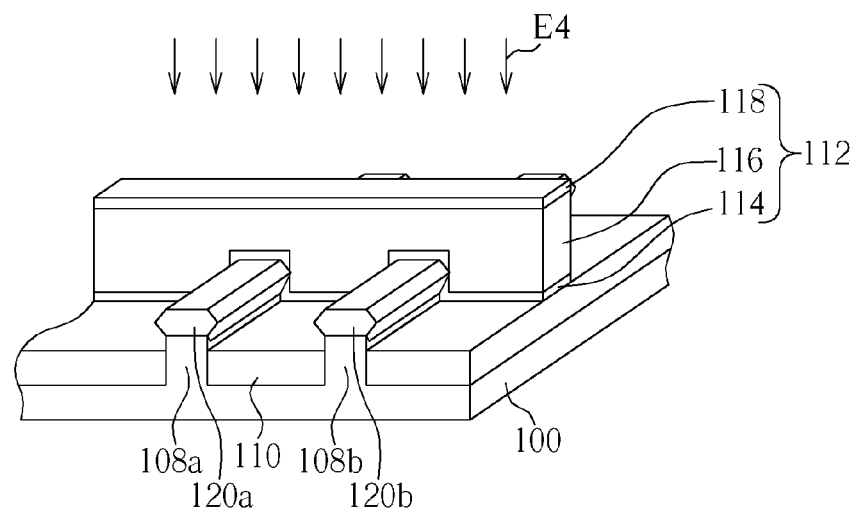

Following the embodiment above, after forming the recess R by etching the fin structures 108a and 108b, as shown in FIG. 9, an epitaxy process E4 is performed to form conformably epitaxial structures 120a and 120b having hexagon-shaped profile structures. Depending on the type of multi-gate FET, the epitaxial structures 120a and 120b may include a SiGe epitaxial layer (for PMOS transistor) or a SiC epitaxial layer (for NMOS transistor). The formed epitaxial structures 120 and 120b may exert a stress on the lattice of the fin structures 108a and 108b under the gate structure 112, to form a strained silicon channel, thereby attaining the efficacy of increasing carrier mobility.

Please note that in the example where common poly-Si is used as the material for the gate electrode 116, an additional gate pre-pullback process will be performed on the poly-Si gate electrode 116 before the epitaxy process in order to avoid the epitaxial structure 120 to simultaneously grow on the gate structure 112 during the epitaxy process E2 or E4. This issue may bridges the gate structures 112 and fin structures 108. The gate pre-pullback process may include an oxidizing treatment or a nitridizing treatment to form an oxide layer or a nitride layer on the exposed surface of the gate electrode 116. This way, the epitaxial layer will not grow on poly-Si gate electrode 116, thus preventing the bridging of gate structures 112 and fin structures 108.

Figure 10:
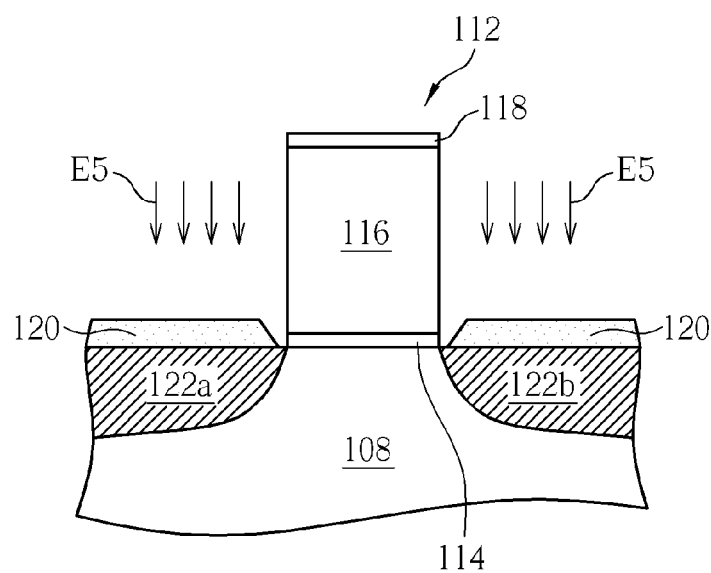

After the formation of the gate structures and the fin structures, the following embodiment will be based on the structure shown in FIG. 7 to explain the subsequent steps of the present invention with reference to the exemplified cross-sectional views in order to provide a better understanding for the reader. FIG. 10 is a cross-sectional view taken from the line A-A' in FIG. 7, which illustrates a non-planar semiconductor structure comprising a fin structure 108, a gate structure 112 on said fin structure 108, and an epitaxial structures 120 covering the fin structures 108 at both sides of the gate structure 112, wherein said gate structure 112 includes a cap layer 118, agate electrode 116, and a gate oxide layer 114.

In the present invention, as shown in FIG. 10, an ion implantation process E5 is performed to implant adequate dopants in the epitaxial structures 120 and the fin structures 108 after the formation of the epitaxial structures 120, thereby forming predetermined source/drain areas 122a/122b in said fin structures 108. The dopants to be implanted depended on the type of semiconductor device; it may be n-type dopant such as phosphor (P) or arsenic (As) (for NMOS transistor), or p-type dopant such as boron (B) (for PMOS transistor).

Figure 11:
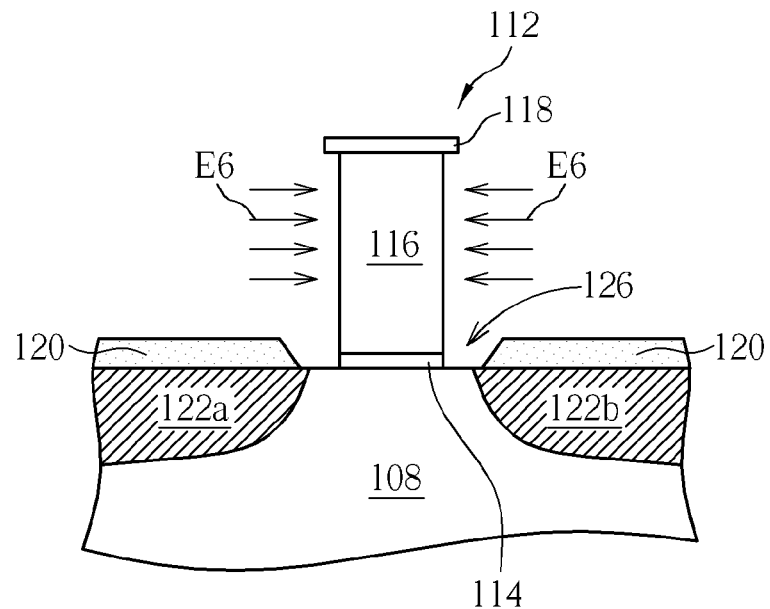

After the formation of the source/drain regions 122a/122b, as shown in FIG. 11, a gate pullback process E6 is performed to trim the critical dimension (CD) of the gate structure 112. The gate pullback process E6 maybe a wet etching process, which may etch the sidewalls of the gate structure 112 and reduce the critical dimension of gate structure. For example, when the material of the gate electrode in the dummy gate is poly-Si, SiN, SiON, SiCN or advanced pattern film (APF) provided by Applied Materials, the etchant for wet etching may be diluted KOH, HF/EG (ethylene glycol mix chemical) or low temperature $H_3PO_4$, respectively. $O_2$ plasma may also be used. The gate pullback process E6 may only etch the sidewalls of the gate structure 112 without damaging the epitaxial structures 120 or trimming the height of the gate structure 112 thanks to the protection of the cap layer 118. The gate pullback process E6 not only reduce the CD of the gate structure 112 between the epitaxial structures 120, but also separate the gate structure 112 and the epitaxial structure 120 at both sides to expose the fin structure 108 thereunder, thereby forming a recess structure 126.

Figure 12:
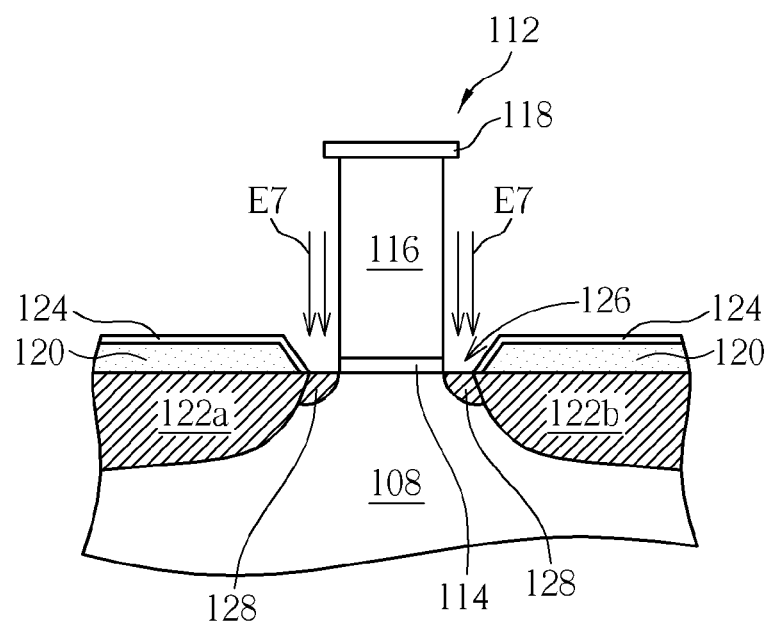

After the gate pullback process E6, please refer to FIG. 12. An ion implant process E7 is subsequently performed to implant dopants into the exposed fin structure 108, thereby forming lightly doped drains (LDD) 128 at both sides of gate electrode 116. Similar to the fabrication of the source/drain regions 122a/122b, the material of the implanted dopants depends on the type of semiconductor device: it may be n-type dopants such as phosphor (P) or arsenic (As) (for NMOS transistor), or p-type dopants such as boron (B) (for PMOS transistor). In the present invention, since the dopants may be implanted into the fin structures 108 without being blocked by the spacer, the doping concentration and the doping profile of the formed lightly doped drain 108 may be precisely controlled.

In a further embodiment of the present invention, a salicide process may be performed to form a salicide layer 124 on the surface of the epitaxial structures 120 and the gate structure 112 after the formation of the epitaxial structures 120, wherein the salicide process may include a post clean process, a metal depositing process, an annealing process, a selective etching process, or a test process, etc. The forming process of the salicide layer is well-known in the art, no unnecessary detail is given herein for simplicity. Alternatively, the above-mentioned salicide process may be performed after the following replacement metal gate process or after the formation of contact holes.

Figure 13:
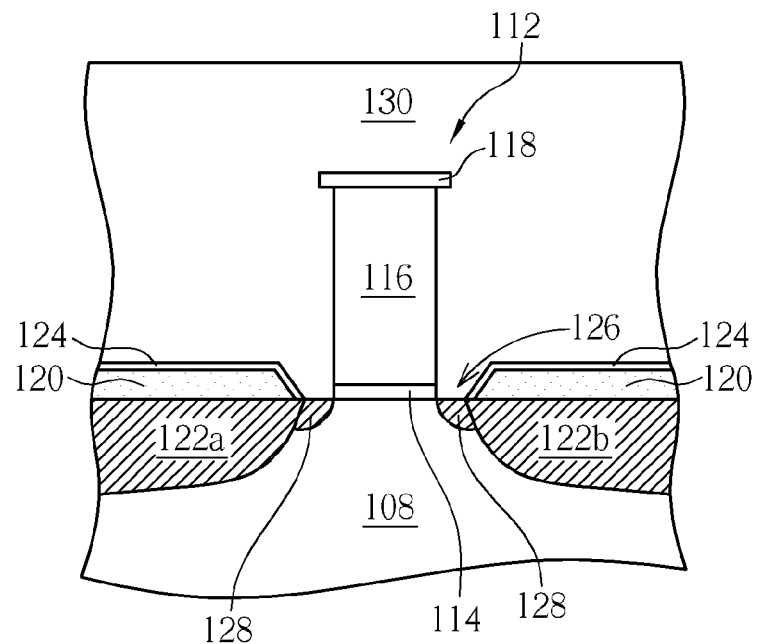

After the formation of the lightly doped drain 128, as shown in FIG. 13, the whole substrate is blanket-deposited with a material layer 130 as the material source for a spacer in a following process. Please note that, in one preferred embodiment of the present invention, the material layer 130 may be formed by spin-on-glass (SOG) process or flowable CVD (FCVD). Furthermore, low-k material (ex. polysiloxane) may be adopted in those processes to form the material layer 130. In further embodiments of the present invention, a liner layer (ex. $Si_3N_4$, SiON, or SiCN layer, not shown) may be formed on the substrate before the formation of the material layer 130 to facilitate the formation of the material layer 130 on the substrate, and improve the reliability of the gate device.

Figure 14:
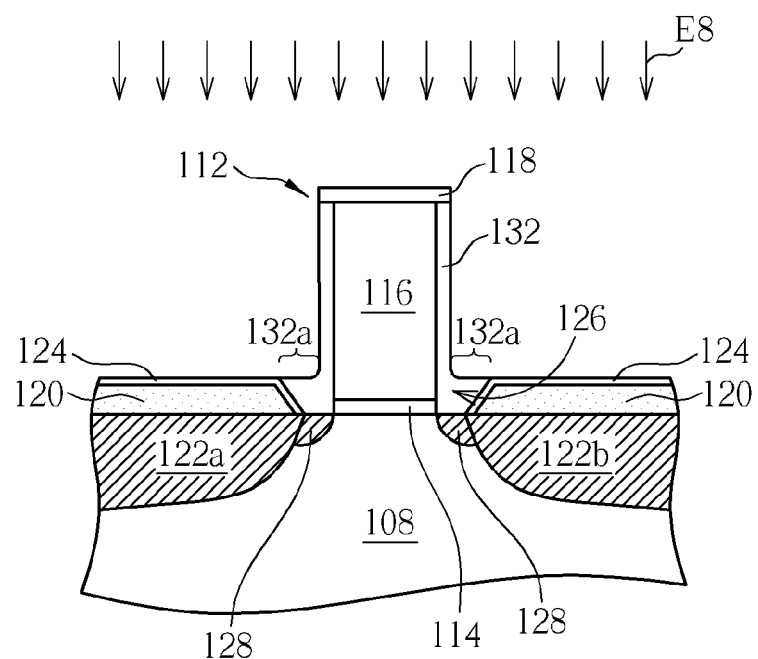
Figure 15:
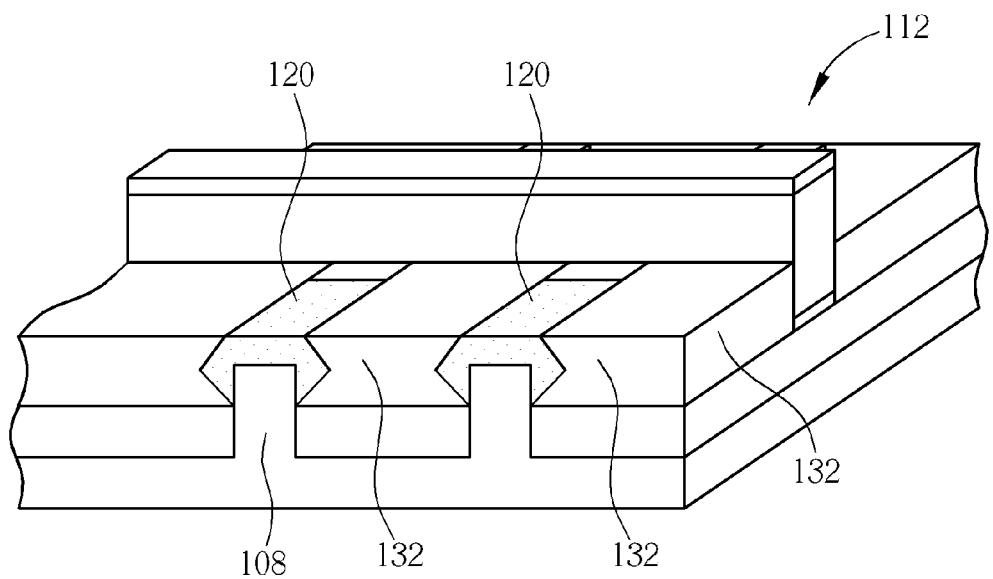
FIG. 15 is a prospective view illustrating the gate device formed by the process of present invention.

Please refer to FIG. 14. After the formation of the material layer 130, an etching process E8 is performed to etch the material layer 130, thereby forming a spacer 132 on the sidewalls of the gate structure 112 and the epitaxial structure 120. The etching process E8 may comprise an etch-back process for the material layer 130 and a dry etching process to form the spacer 132. The etch back process may etch the original material layer 130 until the thickness of the material layer 130 reaches a predetermined value, while the dry etching process is for etching the remaining material layer 130 to the spacer 132. Please note that, in a preferred embodiment of the present invention, the formed spacer 132 is filled up the recess 126 between the gate structure 112 and the epitaxial structures 120 and the spacing between the fin structures 108. Furthermore, a portion 132a of the spacer 132 is leveled with or lower than the abutted epitaxial structures 120.

Please refer to FIG. 15. FIG. 15 is a prospective view illustrating the gate device formed by the process of the present invention. As shown in the figure, for the final structure formed in present invention, it is possible that not all of the sidewalls of the gate structure 112 are covered by the spacer 132 due to the etching process. In this embodiment, only the sidewalls that are lower than the level of the top surface of the epitaxial structures 120 will be covered by the spacer 132, and the spacer filled in the recess 126 will be leveled with or lower than the epitaxial structures 120.

To sum up the above embodiment, in the present invention, it is possible to form a spacer with low-K material by using a SOG process or a FCVD process. The parasite capacitance may be efficiently reduced by forming the spacer structure with such low-K material. Moreover, the recess 126 between the gate structure 112 and the epitaxial structures 120 may be filled completely with the formed spacer due to the excellent gap-filling capacity of the processes.

The process flow of the present invention may be applied in the fabrication of planar semiconductor device. In following embodiments, the flow for planar semiconductor devices with the processes of the present invention will be explained with reference to FIGS. 16-20. First, please refer to FIG. 16, a substrate 300 is provided as the base of a whole semiconductor structure. The substrate 300 may be, but not limited to, a silicon substrate, an epitaxial silicon substrate, a silicon germanium (SiGe) substrate, a silicon carbide (SiC) substrate, or a silicon-on-insulator substrate, etc. The substrate 300 may be provided with already predetermined NMOS regions and PMOS regions, and corresponding P-wells and N-wells. Subsequently, a patterned gate structure 302 is formed on the substrate 300. The process for forming the gate structure 302 comprises the steps of: forming a gate oxide layer 304, a gate electrode 306, and a cap layer 308 successively on the substrate 300, patterning the cap layer 308, performing an etching process on the gate electrode 306 by using the patterned cap layer 308 as a mask to form the patterned gate electrode 306 and a gate oxide layer 304. The method for forming the gate electrode and the gate oxide layer is well-known in the art, therefore no unnecessary detail is given herein for simplicity.

In the present invention, a gate pullback step is performed in the following process to trim the critical dimension (CD) of the gate structure 302, and a replacement metal gate process may be optionally performed after the formation of the gate device to replace the gate electrode with at least a work function metal and at least a low-resistivity metal. For this purpose, the material of the gate electrode 306 may be poly-Si, SiN, SiON, SiCN or advanced pattern film (APF) provided by Applied Materials, or a combinations thereof, while the corresponding cap layer 118 maybe SiN or $SiO_2$. The detailed description of above-mentioned pullback process and optional replacement metal gate process will be explained in a following embodiment.

Figure 16:
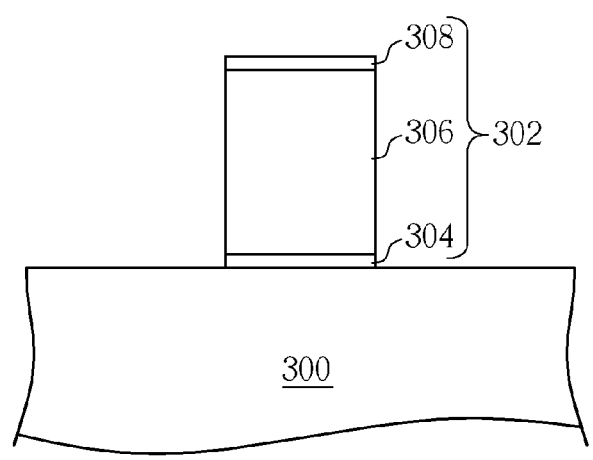
FIGS. 16-21 are cross-sectional views illustrating the flow of a planar semiconductor process in accordance with another embodiment of present invention.

After defining the pattern of the gate structure 302, as shown in FIG. 16, an etching process E9 is performed to form recesses 310 in the substrate 300 for the formation of epitaxial structures in a following process. The etching process E9 may include a first dry etching process and a first wet etching process, wherein the first dry etching process provides downward etching by using SF6-based etchant or NF3-based etchant, which are etch-selective to the substrate 300. The first wet etching process provides downward etching and lateral etching, thereby forming a concave surface 310a concaved in the direction towards the gate structure 302 in the substrate 300.

Please note that the structure shown in the cross-sectional view of FIG. 16 is similar to the structure shown in previous FIG. 8 (etching the fin structure 108 first and then growing the epitaxial structure 120), thus the steps described after FIG. 16 may also be applied to the process flow of the structure shown in FIG. 8.

Figure 17:
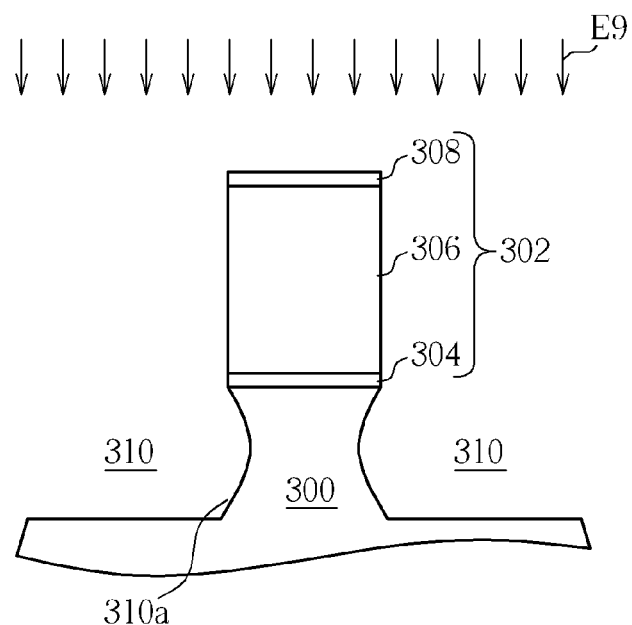
Figure 18:
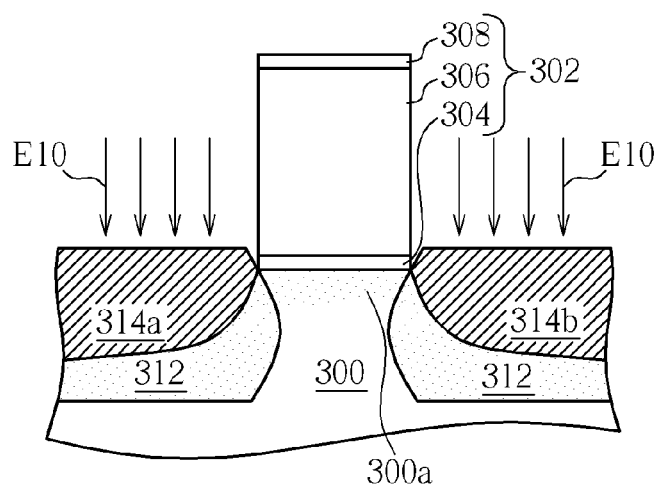

In the following process, please refer to FIG. 17, a selective epitaxial growth (SEG) process is performed to grow epitaxial structures 312 in the recess 310 of previous step. The epitaxial structure 312 is used as a stress source for straining the abutted silicon channel. In the present embodiment, the epitaxial structure 312 may be made of SiGe (for PMOS transistor) or SiC (for NMOS transistor) which will exert a stress on the abutting silicon channel region 10a, thereby improving the carrier mobility.

Please refer again to FIG. 18, in the embodiment of the present invention, an ion implantation process is subsequently performed on the epitaxial structure 312 formed in previous steps. This process may implant n-type dopants (ex. P, As, or Sb), p-type dopants (ex. B or $BF_2$) combining with other common dopants (ex. C, N, F, Ge, or Si) into the epitaxial structure 312 in corresponding NMOS regions or PMOS regions, thereby defining the source/drain regions 314a/314b in the epitaxial structure 312 at both sides of the gate structure 302.

Figure 19:
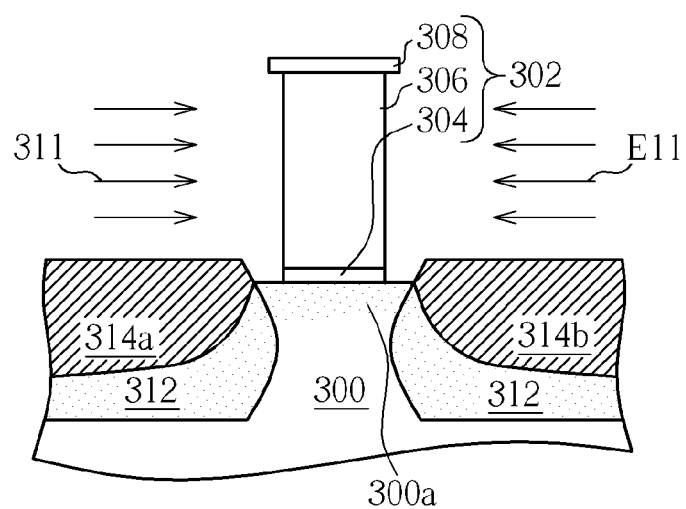

Please refer no to FIG. 19. Similarly, after the formation of source/drain regions 314a/314b, a gate pullback process E11 is performed to trim the critical dimension (CD) of the gate structure 302. The gate pullback process E11 may be a wet etching process which may etch the sidewalls of the gate structure 302; therefore the critical dimension of the gate structure may be reduced. Depending on the material of the gate electrode 306, the etchant for wet etching may be diluted KOH, HF/EG (ethylene glycol) mix chemical, low temperature $H_3PO_4$. $O_2$ plasma may also be used. The gate pullback process E11 may only etch the sidewalls of the gate structure 302 without damaging the epitaxial structure 312 or trimming the height of the gate structure 302 thanks to the protection of cap layer 308. The gate pullback process E6 will reduce the CD of the gate structure 302 between the epitaxial structures 312, thereby exposing the fin structure 108 thereunder.

Similarly, please note that in the example where common poly-Si is used as the material for the gate electrode 306, a gate pre-pullback process is performed on the poly-Si gate electrode 306 before the epitaxy process, in order to prevent the epitaxial structure 312 from simultaneously growing on the gate structure 302 during the epitaxy process, and bridging the gate structures 302 and the substrate 300. The gate pre-pullback process may include an oxidizing treatment or a nitridizing treatment to form an oxide layer or a nitride layer (not shown) on the exposed surface of the gate electrode 306. This way, the epitaxial structure will not grow on the poly-Si gate electrode 306, thus preventing the bridging of the gate structures 302 and the substrate 300.

Figure 20:
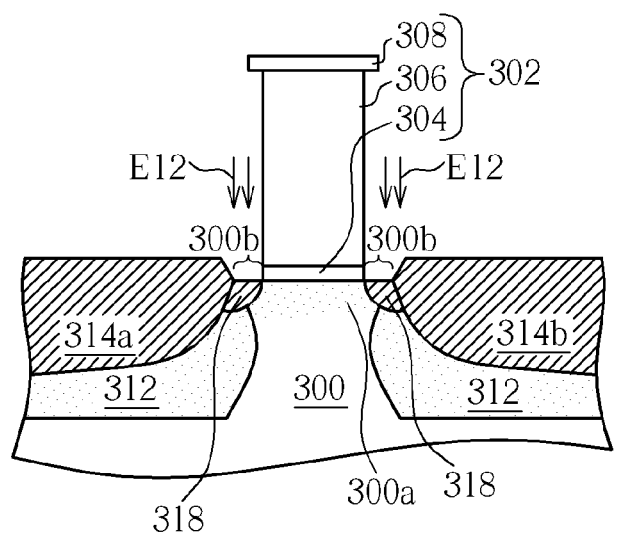

After the gate pullback process E11, please refer to FIG. 20: an ion implantation process E12 is performed to implant dopants into the exposed substrate 300b; thereby forming lightly doped drains (LDD) 318 at both sides of the gate structure 302. Similar to the fabrication of source/drain regions 314a/314b, the material of the implanted dopant depends on the type of semiconductor device: it may be n-type dopants such as phosphor (P) or arsenic (As) (for NMOS transistor), or p-type dopants such as boron (B) (for PMOS transistor). In the present invention, since the spacer is not formed yet on the gate structure 302 at this stage, the dopants may be implanted into the substrate 300b without being blocked by the spacer. Moreover, for the pull backed gate structure, an optional multiple tilt angle implantation may be performed to further precisely control the doping concentration and the doping profile of the formed lightly doped drain 108.

Figure 21:
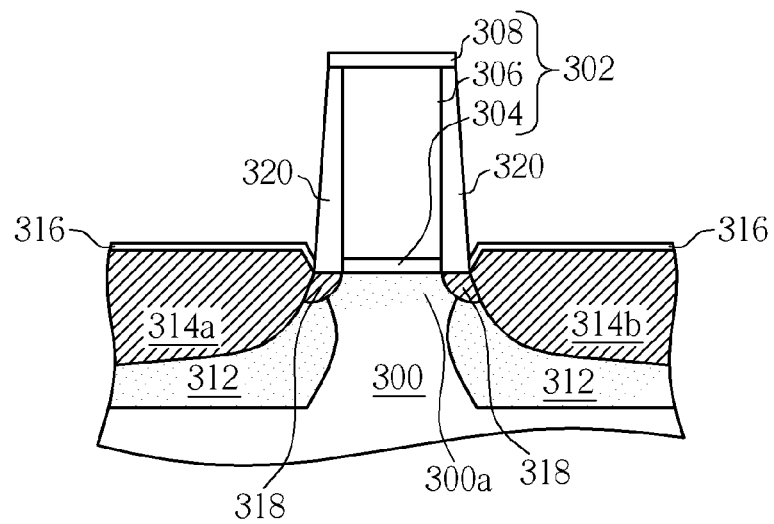

After the formation of the lightly doped drains 318, as shown in FIG. 21, the spacer 320 is formed on the sidewalls of the gate structure 302. The spacer 320 maybe formed by depositing and etching a material layer. This process is well-described in the previous embodiments and no unnecessary additional detail is given herein for simplicity.

In a further embodiment of the present invention, a salicide process maybe performed to form the salicide layer 316 on the surface of the source/drain regions 314a/314b after the formation of the spacer 320. Alternatively, the above-mentioned salicide process may be performed after the following replacement metal gate process or after the formation of contact holes. The salicide process may include a post cleaning process, a metal depositing process, an annealing process, a selective etching process, or a test process, etc. The forming process of salicide layer is well-known in the art, and is not described further herein. A full gate device is, therefore, completed.

In the following embodiment, a replacement metal gate (RMG) process (i.e. gate last process) is explained with references to the FIGS. 22-25. The replacement metal gate process is an advantageous process, which is able to avoid processes of high thermal budget and to provide wider material choices, thus gradually replacing the gate first processes. Please note that the replacement metal gate process may be applied to both of the above-described non-planar and planar semiconductor processes without any process incompatibility issues. FIGS. 22-25 are based on the completed structure shown in FIG. 14. Some components shown in FIG. 22-25 may be different from the ones shown in FIG. 14, but the entire process will not be influenced by those differences.

Figure 22:
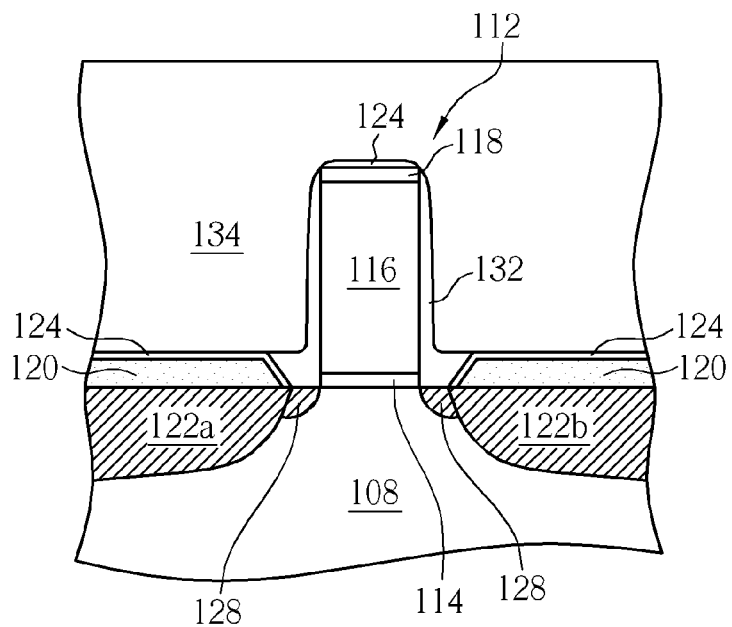
FIGS. 22-25 are cross-sectional views illustrating the flow of a replacement metal gate process in accordance with one further embodiment of present invention.

Please refer to FIG. 22. FIG. 22 illustrates the completed semiconductor device shown in the embodiment of FIG. 14, which comprises a gate structure 112, a fin structure 108, and an epitaxial structure, etc. A deposition process is first performed on the substrate to selectively grow a contact-etch stop layer (CESL, not shown) and an inter-layer dielectric layer (ILD) 134. The ILD layer 134 is blanket-deposited on the substrate (including the region of the whole gate structure 112 and the epitaxial structure 120) and has a predetermined thickness over the gate structure 112.

Figure 23:
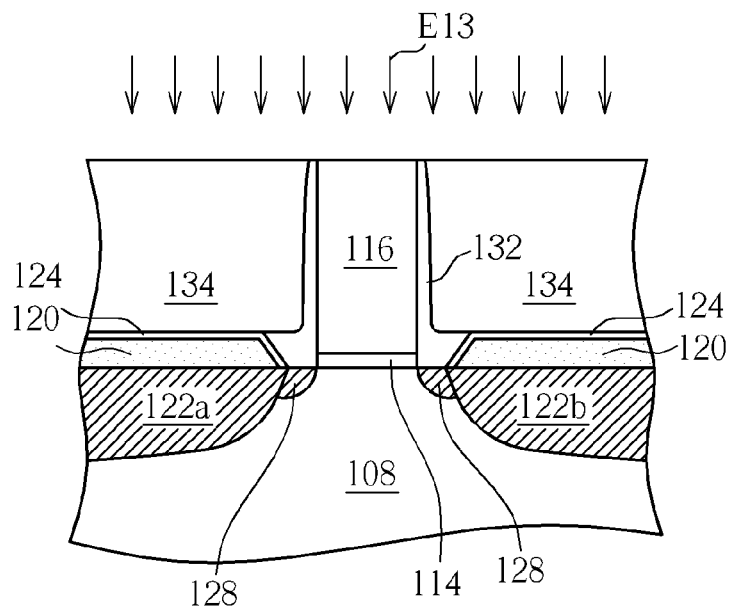

Please refer subsequently to FIG. 23. After the formation of the ILD layer 134, parts of the ILD layer 134 and of the cap layer 118 are removed by a planarization process E13 to expose the gate electrode 116 in the gate structure 112. The gate electrode 116 serves as a dummy gate in this embodiment and will be removed in a following process.

Figure 24:
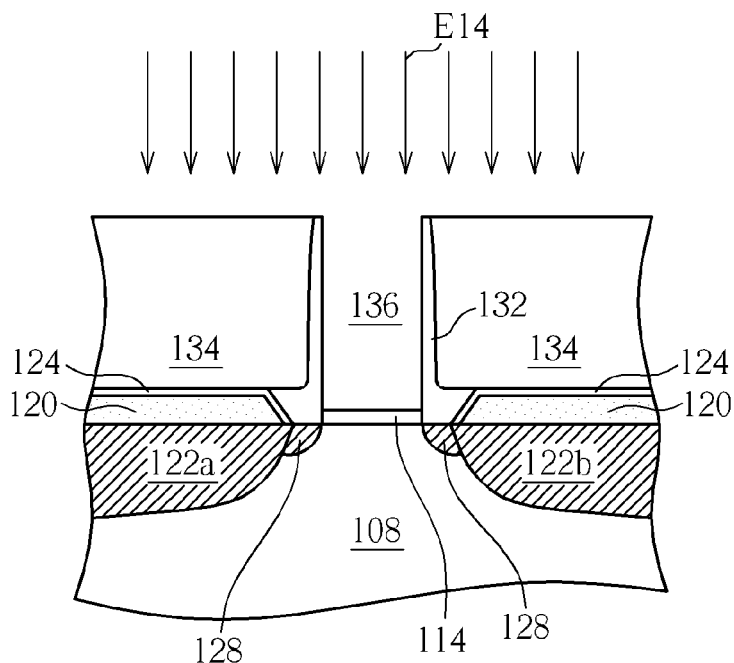
Figure 25:
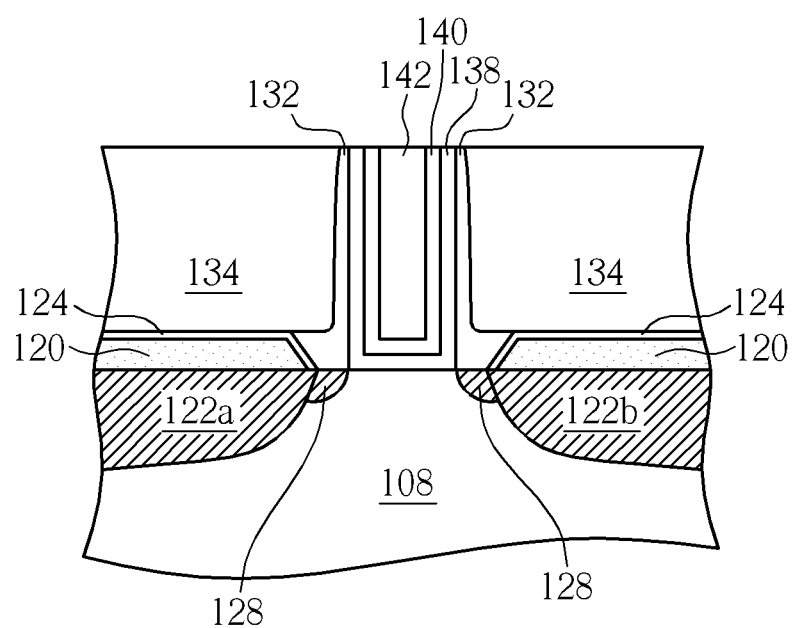

After the planarization process E13, as shown in FIG. 24, an etching process E14 is performed to etch the exposed gate electrode 116. The gate electrode 116 is then completely removed in this step to expose the gate dielectric layer 114 thereunder. A gate trench 136 is formed in this process to provide a space for the gate metal material.

It is worth noting that the present embodiment maybe integrated with the high-K first process. In this kind of process, the gate dielectric layer 114 includes high-k materials, such as rare earth metal oxides. The gate dielectric layer 114 in this case is formed before the patterning of the gate structure 112 and will be patterned simultaneously with the gate structure 112. The above-mentioned high-k gate dielectric layer 114 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_1$-$xO_3$, PZT), and barium strontium titanate ($Ba_xSr_1$-x $TiO_3$, BST). Additionally, an interfacial layer (not shown) can be formed between the high-k gate dielectric layer 104 and the substrate 100. After forming the first gate trench 150 and the second gate trench 152, an etch stop layer 108 can be formed on the bottom barrier layer 106 in both of the first gate trench 150 and the second gate trench 152. The etch stop layer 108 can include tantalum nitride (TaN), but not limited to this. In this embodiment, a bottom barrier layer (ex. a TiN layer) and an etching stop layer (ex. a TaN layer) may be additionally formed on the gate dielectric layer 114 in the gate trench 136. No unnecessary detail is given herein for simplicity.

On the other hand, the present embodiment may also be integrated with the high-K last process. In this process, a high-K gate dielectric layer (as the gate dielectric layer 138 shown in FIG. 25) is formed on the substrate (including the surface of the gate trench 136) after removing of the dummy gate and forming the gate trench 136, rather than formed before the patterning of the gate structure 112. Similarly, a bottom barrier layer (ex. a TiN layer) and an etching stop layer (ex. a TaN layer) may be additionally formed on the gate dielectric layer 114 in the gate trench 136. No unnecessary detail is given herein for simplicity.

Please refer again to the FIG. 25, after the formation of the gate dielectric layer 138, a chemical vapor deposition (CVD), a physical vapor deposition (PVD), or an atomic layer deposition (ALD) is performed to form a work function metal layer (WFM, 140) in the gate trench 136. The work function metal layer 140 may be a p-type work function metal layer and exemplarily includes TiN, TaN, titanium carbide (TiC), tantalum carbide (TaC), tungsten carbide (WC), or aluminum titanium nitride (TiAlN), but not limited to this. Alternatively, the work function metal layer 140 may be an n-type work function metal layer and exemplarily includes titanium aluminide (TiAl), zirconium aluminide (ZrAl), tungsten aluminide (WA1), tantalum aluminide (TaAl), or hafnium aluminide (HfAl), but not limited to this. In addition, the work function metal layer 140 may be a single-layered structure or a multi-layered structure. For example, the work function metal layer 140 may comprises a plurality of different work function metal layers, to optimize the electrical properties of the gate device.

After the formation of work function metal layer 140, a top barrier layer (not shown) may be optionally formed in gate trench 136, and a filling metal layer 142 is then formed thereon. The filling metal layer 168 is formed to fill up the gate trench 136. The filling metal layer 168 includes materials with low resistivity and superior gap-filling characteristics, such as Al, W, Cu, TiAl, or titanium aluminum oxide (TiAlO), but not limited to this.

After forming the gate electrode above, one or more planarization process is finally performed, such as a CMP process, to remove the unnecessary filling metal layer 142, work function metal layer 140, and gate dielectric layer 138, thereby completing the fabrication of a replacement metal gate structure. In addition, another embodiment of the present invention may continue the process after the formation of the replacement metal gate structure. This process involves the steps of completely removing the ILD layer 134 and the CESL layer, and then forming another ILD layer and a CESL layer (not shown) to ensure that the CESL layer can provide a sufficient and adequate compressive or tensile stress. Please note that the above-described replacement metal gate (RMG) process is only an exemplified embodiment, which briefly explain the basic steps for fabricating the various components in the replacement metal gate structure. Some repeating steps, or necessary components, may be omitted in this description without obscuring the principles of the RMG process combined with the semiconductor process of the present invention.

To sum up the processes and all technical features provided in the above embodiments of the present invention, a novel non-planar semiconductor structure is accordingly provided in the present invention. The non-planar semiconductor structure is provided with technical features formed or embodied by the process flow of the present invention, as shown in FIG. 9 and FIG. 14, comprising: a substrate 100, at least one fin structure 120 on the substrate 100; a gate 112 covering parts of the fin structures 108 and parts of the substrate 100, a plurality of epitaxial structures 120 covering the fin structures 120 at both side of the gate 112 and being separated from the gate 112, wherein each of the gate 112, the epitaxial structures 120, and the fin structures 108 define a recess 126, a source 122a and a drain 122b, formed respectively in the fin structures 108 and the epitaxial structures 120 at both sides of the gate 112; lightly doped drains formed respectively in the fin structures 108 between the gate 112 and the epitaxial structures 108 at both sides of the gate 112, and a spacer 12 formed on the sidewalls of the gate 112 and the epitaxial structures 108, wherein the portion of the spacer 132 filling in the recess 126 is leveled with the top surface of the epitaxial structures 120.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-planar semiconductor process, comprising the steps of:
    providing a substrate;
    forming at least one fin structure on said substrate;
    forming a gate covering parts of said fin structures;
    forming a plurality of epitaxial structures covering said fin structures at both sides of said gate;
    forming a source and a drain respectively in said fin structures and said epitaxial structures at both sides of said gate;
    performing a gate pullback process to trim said gate such that said gate and said epitaxial structures at both sides of said gate are separated;
    performing an ion implantation process to form a lightly doped drain (LDD) respectively in said fin structures between said gate and said epitaxial structures at both sides of said gate; and
    forming a spacer on the sidewalls of said gate and said epitaxial structures.

2. A non-planar semiconductor process according to claim 1, wherein the step of forming a spacer comprises:
    forming a material layer of said spacer by spin-on-glass (SOG) process or flowable CVD (FCVD); and
    etching said material layer to form said spacer.

3. A non-planar semiconductor process according to claim 2, wherein said material layer comprises low-K material, such as polysilozane.

4. A non-planar semiconductor process according to claim 2, further comprising the step of forming a liner layer, such as $Si_3N_4$, SiON, or SiCN layer, on said substrate before forming said spacer.

5. A non-planar semiconductor process according to claim 1, wherein said substrate comprises bulk silicon.

6. A non-planar semiconductor process according to claim 5, wherein the step of forming at least one fin structure on said substrate comprises:
    forming a mask layer on said substrate; and
    patterning said mask layer and etching said substrate by using said patterned mask layer as a mask to form said fin structures.

7. A non-planar semiconductor process according to claim 6, wherein said mask layer comprises a pad oxide layer and a nitride layer.

8. A non-planar semiconductor process according to claim 5, wherein said substrate comprises:
    a substrate;
    a bottom oxide layer on said substrate; and
    a silicon layer on said bottom oxide layer.

9. A non-planar semiconductor process according to claim 8, wherein the step of forming at least one fin structure on said substrate comprises:
    patterning said silicon layer to form said fin structures and expose part of said bottom oxide layer between said fin structures.

10. A non-planar semiconductor process according to claim 1,
    wherein
    the step of forming a plurality of epitaxial structures covering said fin structures at both sides of said gate comprises:
    performing an etching process to etch part of said fin structures at both sides of said gate for forming at least one recess in said fin structures; and
    performing a epitaxy process to form epitaxial structures in said recesses.

11. A non-planar semiconductor process according to claim 1, wherein the material of said gate comprises poly-Si.

12. A non-planar semiconductor process according to claim 11, further comprising performing a gate pre-pullback process to oxidize or nitridize the exposed surface of said gate before the step of forming said a plurality of epitaxial structures.

13. A non-planar semiconductor process according to claim 11, wherein the step of performing a gate pullback process to trim said gate comprises etching said gate with diluted potassium hydroxide (KOH).

14. A non-planar semiconductor process according to claim 1, wherein the material of said gate comprises silicon nitride (SiN), silicon oxynitride (SiON), silicon carbonitride (SiCN) or advanced pattern film (APF).

15. A non-planar semiconductor process according to claim 14, wherein the step of performing a gate pullback process to trim said gate comprises etching said gate with the material selected from the group of: HF/EG (ethylene glycol) mix chemical, low temperature phosphoric acid ($H_3PO_4$), or $O_2$ plasma.

16. A non-planar semiconductor process according to claim 1, wherein said gate is a dummy gate, and further comprising performing a replacement metal gate (RMG) process to replace said gate with a metal electrode layer.

17. A non-planar semiconductor process according to claim 16,
    wherein said replacement metal gate process comprises the steps of:
    covering an interlayer dielectric layer (IDL) on said entire substrate;

performing a planarizing process to remove part of said interlayer dielectric layer (IDL) until said dummy gate is exposed;

performing an etching process to remove exposed said dummy gate and form a gate trench;

forming a work function metal (WFM) layer in said gate trench; and forming a filling metal layer in said gate trench.

18. A non-planar semiconductor process according to claim 17, wherein said replacement metal gate process is a high-K first process further comprising the step of forming a high-K layer on said substrate before forming said gate.

19. A non-planar semiconductor process according to claim 17, wherein said replacement metal gate process is a high-K last process further comprising the step of forming a high-K layer in said gate trench before forming said work function metal layer.

20. A non-planar semiconductor process according to claim 1, wherein said epitaxial structure comprises a SiGe epitaxial layer or a SiC epitaxial layer.

* * * * *